United States Patent
Asano et al.

(10) Patent No.: US 6,768,482 B2
(45) Date of Patent: Jul. 27, 2004

(54) ACTIVE MATRIX TYPE DISPLAY APPARATUS

(75) Inventors: Mitsuru Asano, Kanagawa (JP); Jiro Yamada, Kanagawa (JP); Takao Mori, Kanagawa (JP); Mitsunobu Sekiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 282 days.

(21) Appl. No.: 09/990,414

(22) Filed: Nov. 21, 2001

(65) Prior Publication Data

US 2002/0070909 A1 Jun. 13, 2002

(30) Foreign Application Priority Data

Nov. 22, 2000 (JP) ..................................... P2000-355195
Sep. 28, 2001 (JP) ..................................... P2001-299647

(51) Int. Cl.[7] ................................................ G09G 3/36
(52) U.S. Cl. ........................................ 345/90; 345/100
(58) Field of Search ............................. 345/90, 1.1, 36, 345/55, 76, 77, 100; 349/5, 57, 95, 151, 73; 313/483; 250/208.1; 438/690; 204/192.1; 257/89

(56) References Cited

U.S. PATENT DOCUMENTS

| | | | | |
|---|---|---|---|---|
| 5,604,613 A | * | 2/1997 | Shinjo et al. ................ | 349/147 |
| 6,104,446 A | * | 8/2000 | Blankenbecler et al. ....... | 349/5 |
| 6,300,612 B1 | * | 10/2001 | Yu ........................... | 250/208.1 |
| 6,335,778 B1 | * | 1/2002 | Kubota et al. .............. | 349/151 |
| 6,498,592 B1 | * | 12/2002 | Matthies ..................... | 345/1.1 |
| 6,608,620 B1 | * | 8/2003 | Suzuki et al. ............... | 345/204 |

* cited by examiner

*Primary Examiner*—Amare Mengistu
*Assistant Examiner*—Prabodh M. Dharia
(74) *Attorney, Agent, or Firm*—Sonnenschein, Nath & Rosenthal LLP

(57) ABSTRACT

In an active matrix type display apparatus according to the present invention, the following measures are provided when stacking, on a substrate, a device layer (light emitting portion) formed by arranging a light emitting portion in a sub-pixel unit and a circuit layer (sub-pixel circuit) formed by arranging a sub-pixel circuit for driving the light emitting portion in the sub-pixel unit: the apparatus has a stripe arrangement as the arrangement of sub-pixel circuits and a delta arrangement as the arrangement of light emitting portions. Therefore, it is possible to improve reliability of the sub-pixel circuits while utilizing the advantages of the delta arrangement of the light emitting portions, and thus realize a high-reliability, high-definition, and high-brightness display apparatus.

19 Claims, 15 Drawing Sheets

FIG. 6A
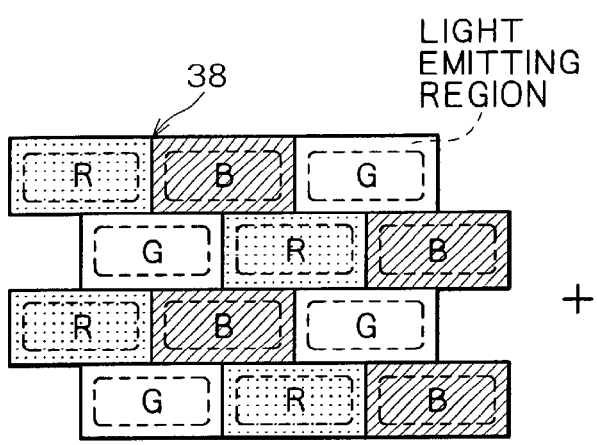
FIG. 6B
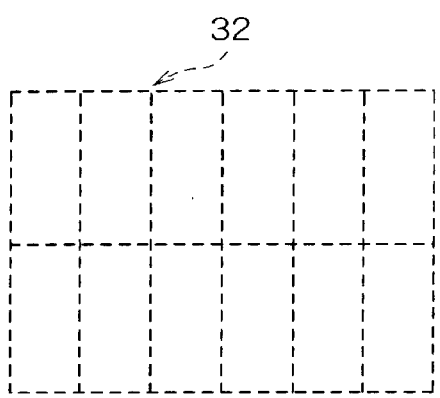
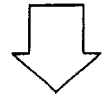
FIG. 6C
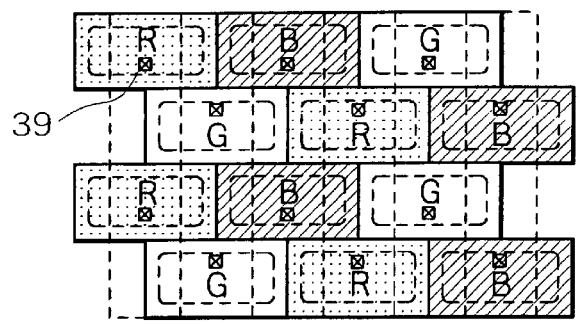

FIG. 8A
LONG AND
NARROW MASK
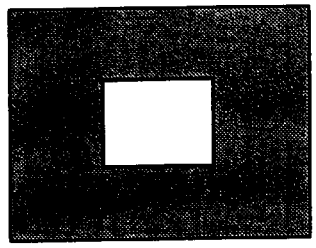
VIEWED FROM ABOVE
VIEWED FROM SIDE
WEAK WITH RESPECT TO OBLIQUE COMPONENT OF DEPOSITION (LARGE ECLIPSE)
FIG. 8B
NEAR-SQUARE MASK
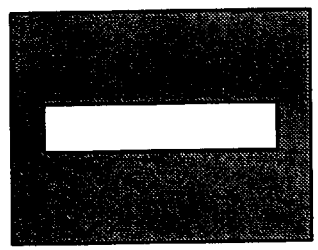
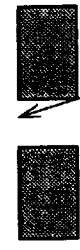
STRONG WITH RESPECT TO OBLIQUE COMPONENT OF DEPOSITION (SMALL ECLIPSE)

FIG. 9A
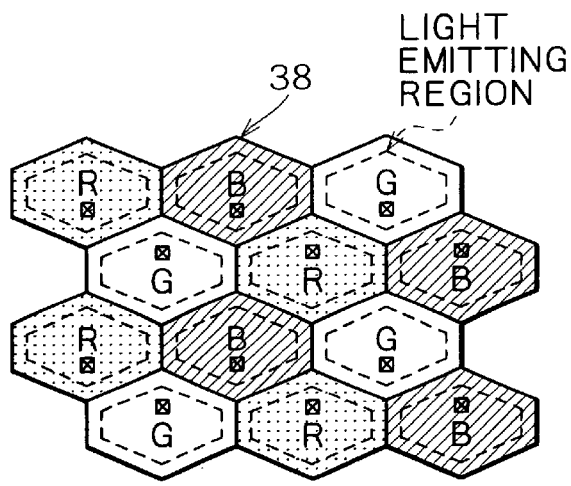
LIGHT EMITTING REGION
FIG. 9B
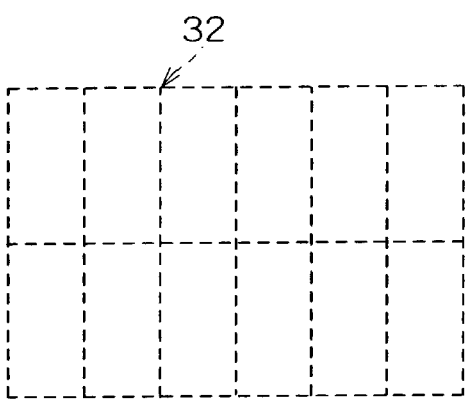
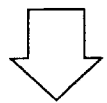
FIG. 9C
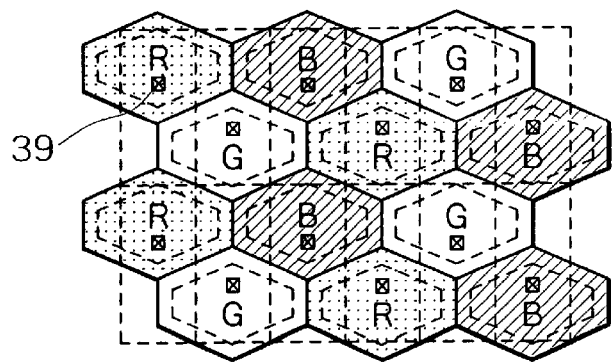

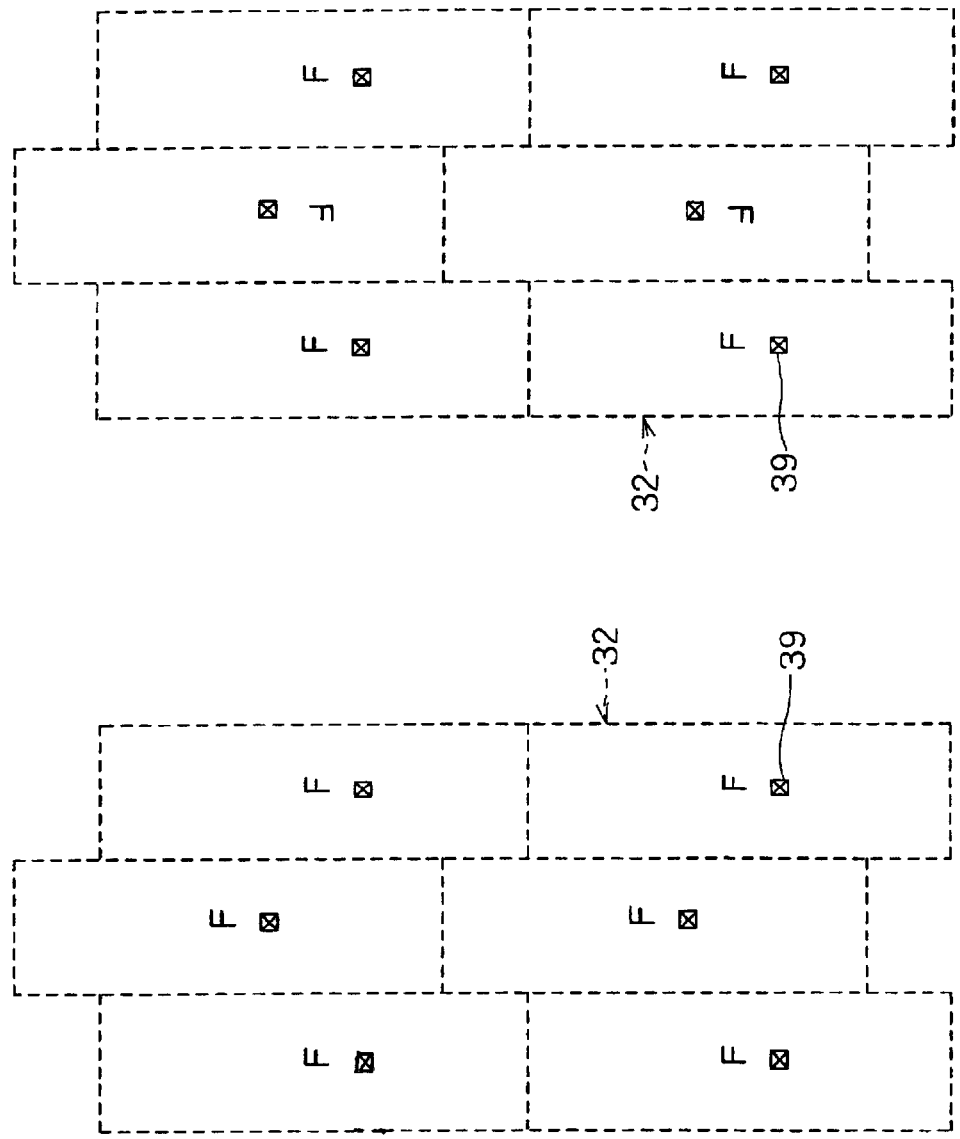

ACTIVE MATRIX TYPE DISPLAY APPARATUS

RELATED APPLICATION DATA

The present application claims priority to Japanese Application(s) No(s). P2000-355195 filed Nov. 22, 2000, and P2001-299647 filed Sep. 28, 2001, which application(s) is/are incorporated herein by reference to the extent permitted by law.

BACKGROUND OF THE INVENTION

The present invention relates to an active matrix type display apparatus that controls display by a sub-pixel unit by means of an active device provided for each sub-pixel, and particularly to an active matrix type organic electroluminescence display apparatus using an electroluminescence device of organic material (hereinafter described as an organic EL device) as a light emitting device (electrooptic device) for each sub-pixel.

Recently, an organic EL display apparatus using an organic EL device as a light emitting device provided for each sub-pixel has been drawing attention as a flat-panel display. The organic EL device has a structure in which an organic material is sandwiched by two electrodes, that is, an anode electrode and a cathode electrode. By applying a voltage between the electrodes, an electron is injected from the cathode electrode into the organic layer and a hole is injected from the anode electrode into the organic layer, where the electron and the hole are recombined with each other, and thereby emit light. The organic EL device can provide a brightness of several hundred to a several ten-thousand $cd/m^2$ at a driving voltage of 10 V or lower. The organic EL display apparatus using the organic EL device as a light emitting device for each sub-pixel is considered promising as a next-generation flat-panel display.

Methods of driving the organic EL display apparatus include a simple (passive) matrix method and an active matrix method. In order to realize larger size and higher definition of the display, the simple matrix method requires that an organic EL device of each sub-pixel momentarily emit light at a high brightness, because an increase in the number of scanning lines (that is, the number of sub-pixels in a vertical direction) means a reduction in light emitting periods of each sub-pixel.

With the active matrix method, on the other hand, it is easy to realize larger size and higher definition of the display, because each sub-pixel continues emitting light for a period of one frame. A thin film transistor (TFT) is generally used as an active device for driving the organic EL device in such an active matrix type organic EL display apparatus.

A sub-pixel driving circuit (hereinafter referred to simply as a sub-pixel circuit) including the TFT and the organic EL device are formed in each sub-pixel as separate layers with one-to-one correspondence with each other. Specifically, the sub-pixel circuit including the TFT is fabricated on a substrate to form a circuit layer. A flattening film is formed on the circuit layer, and then a contact portion for electrically connecting the sub-pixel circuit with the organic EL device is created. The organic EL device formed by sandwiching an organic layer including a light emitting layer between two electrodes is further fabricated on the flattening film and the contact portion, thereby forming a device layer.

The organic layer of a low-molecular-weight organic EL device often used in the organic EL display apparatus is generally formed by vacuum deposition. When the organic EL display apparatus having the low-molecular-weight organic EL device as a sub-pixel is intended for multi-color or full-color display, the organic EL device of each sub-pixel is selectively deposited by using a metal mask or the like. Therefore, high-precision deposition techniques are required. Since deposition accuracy affects sub-pixel pitch, resolution, aperture ratio of a light emitting device, and a defect caused by misalignment in the deposition, the deposition accuracy is important in fabricating a high-brightness, high-definition, and high-reliability organic EL display apparatus.

The simplest sub-pixel arrangement of sub-pixels that emit light in colors of R (red), G (green), and B (blue), for example, in a full-color display with a pixel formed by sub-pixels having three different luminescent colors is a stripe arrangement in which light emitting portions are arranged as sub-pixel units in a stripe form, as shown in FIG. 1. Since in the stripe arrangement, every scanning line and every signal line are orthogonal to each other, the stripe arrangement has an advantage of a simple layout of wiring and the like. For deposition of the organic EL device, however, high deposition accuracy is required, since one sub-pixel in the stripe arrangement has an aspect ratio of $1:\frac{1}{3}$ and hence has a long and narrow shape.

In the present specification, one light emitting sub-pixel is defined as a sub-pixel, and a unit of three adjacent sub-pixels of R, G, and B is defined as a pixel. Also, in a sub-pixel section formed by arranging sub-pixels in a matrix manner, a direction of arrangement of sub-pixels in each row, that is, a direction along a scanning line for selecting a row is defined as a row direction, whereas a direction of arrangement of sub-pixels in each column, that is, a direction orthogonal to the scanning line is defined as a column direction.

As another sub-pixel arrangement, there is a delta arrangement in which light emitting portions are arranged as sub-pixel units in a triangle (delta) form, as shown in FIG. 2. The delta arrangement has an advantage of providing a high apparent display resolution, and is thus often used in a display for image display. In addition, one sub-pixel in the delta arrangement has an aspect ratio of $\frac{1}{2}:\frac{2}{3}$ and hence has a near-square shape. Therefore, a margin of deposition accuracy in the delta arrangement is large as compared with the stripe arrangement.

When light emitting portions are thus arranged as sub-pixel units in the delta arrangement, the same delta arrangement is conventionally employed for sub-pixel circuits including TFTs. When the delta arrangement is employed for sub-pixel circuits, however, arranged positions of sub-pixels adjacent to each other in a vertical direction are shifted with respect to each other by half of a sub-pixel pitch. Accordingly, scanning lines and signal lines are designed so as to be bent along the sub-pixel arrangement, resulting in a complex wiring pattern. Many bends of the wiring increase susceptibility to defects, and cause a decrease in yield. In addition, in some wiring layouts, the wiring crosses a sub-pixel, which may result in a decrease in aperture ratio.

SUMMARY OF THE INVENTION

The present invention has been made in view of the above problems, and it is accordingly an object of the present invention to provide a high-brightness, high-definition, and high-reliability active matrix type display apparatus by improving reliability of sub-pixel circuits while utilizing the advantages of arranging light emitting portions as sub-pixel units in the delta arrangement.

In order to achieve the above object, according to an aspect of the present invention, there is provided an active matrix type display apparatus formed by stacking, on a substrate, a device layer formed by arranging a light emitting portion in a sub-pixel unit and a circuit layer formed by arranging a sub-pixel circuit for driving a light emitting device of the light emitting portion in the sub-pixel unit, the active matrix type display apparatus including: a stripe sub-pixel arrangement (hereinafter referred to as a stripe arrangement) in which the sub-pixel circuits exist on straight lines in both a row direction and a column direction; and a delta sub-pixel arrangement (hereinafter referred to as a delta arrangement) in which the light emitting portions have twice a sub-pixel pitch in the row direction of the sub-pixel arrangement of the sub-pixel circuits and ½ of a sub-pixel pitch in the column direction of the sub-pixel arrangement of the sub-pixel circuits, and a phase difference in sub-pixel arrangement between two rows adjacent to each other is ½ of a pitch in the row direction of the light emitting portions.

The delta arrangement in the active matrix type display apparatus has advantages of providing a high apparent display resolution, enabling high-precision deposition of the light emitting devices, and thus being able to improve reliability of the light emitting devices. Therefore, the delta arrangement as the sub-pixel arrangement of the light emitting portions can contribute to realizing higher definition and higher brightness of the display. On the other hand, the stripe arrangement as the sub-pixel arrangement of the sub-pixel circuits reduces bends of the wiring, which results in a simpler wiring pattern, and can thus enhance reliability of the sub-pixel circuits.

BRIEF DESCRIPTION OF THE DRAWINGS

FIGS. 6A, 6B, and 6C are plan pattern views showing a combination of a sub-pixel arrangement of organic EL devices and a sub-pixel arrangement of sub-pixel circuits;

FIGS. 8A and 8B are diagrams showing the shape of apertures of metal masks;

FIGS. 9A, 9B, and 9C are diagrams showing different shape of light emitting regions of light emitting devices;

FIGS. 16A and 16B are diagrams showing a third configuration of formation of contact portions;

DETAILED DESCRIPTION OF THE PREFERRED EMBODIMENTS

Figure 1:
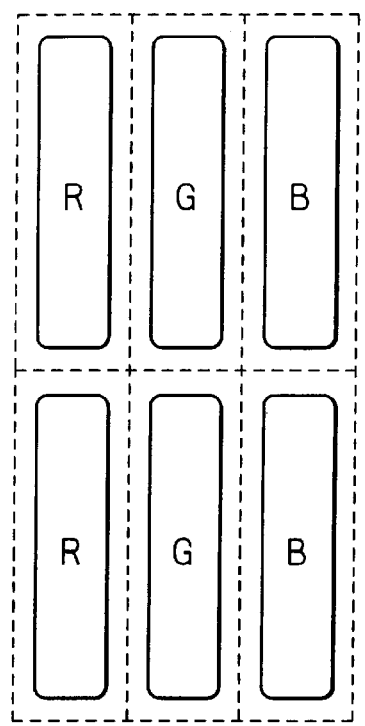
FIG. 1 is a configuration diagram of a stripe sub-pixel arrangement.
Figure 2:
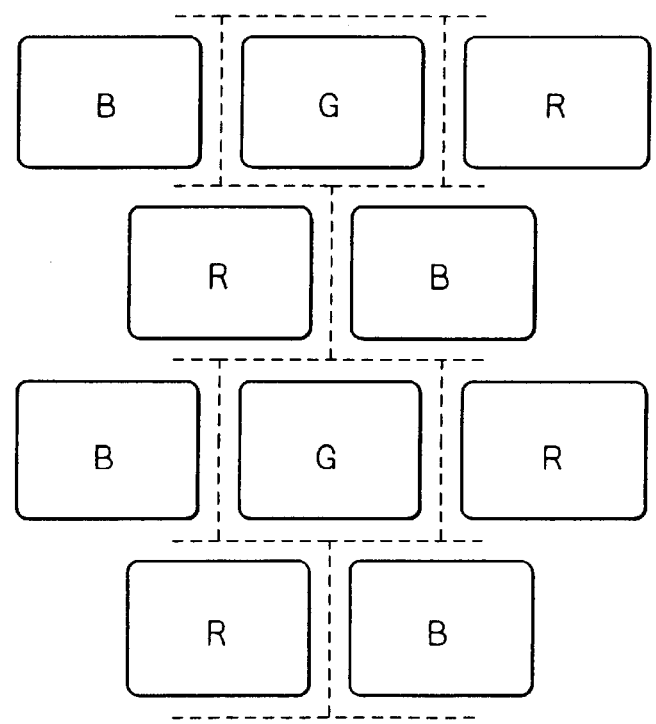
FIG. 2 is a configuration diagram of a delta sub-pixel arrangement.
Figure 3:
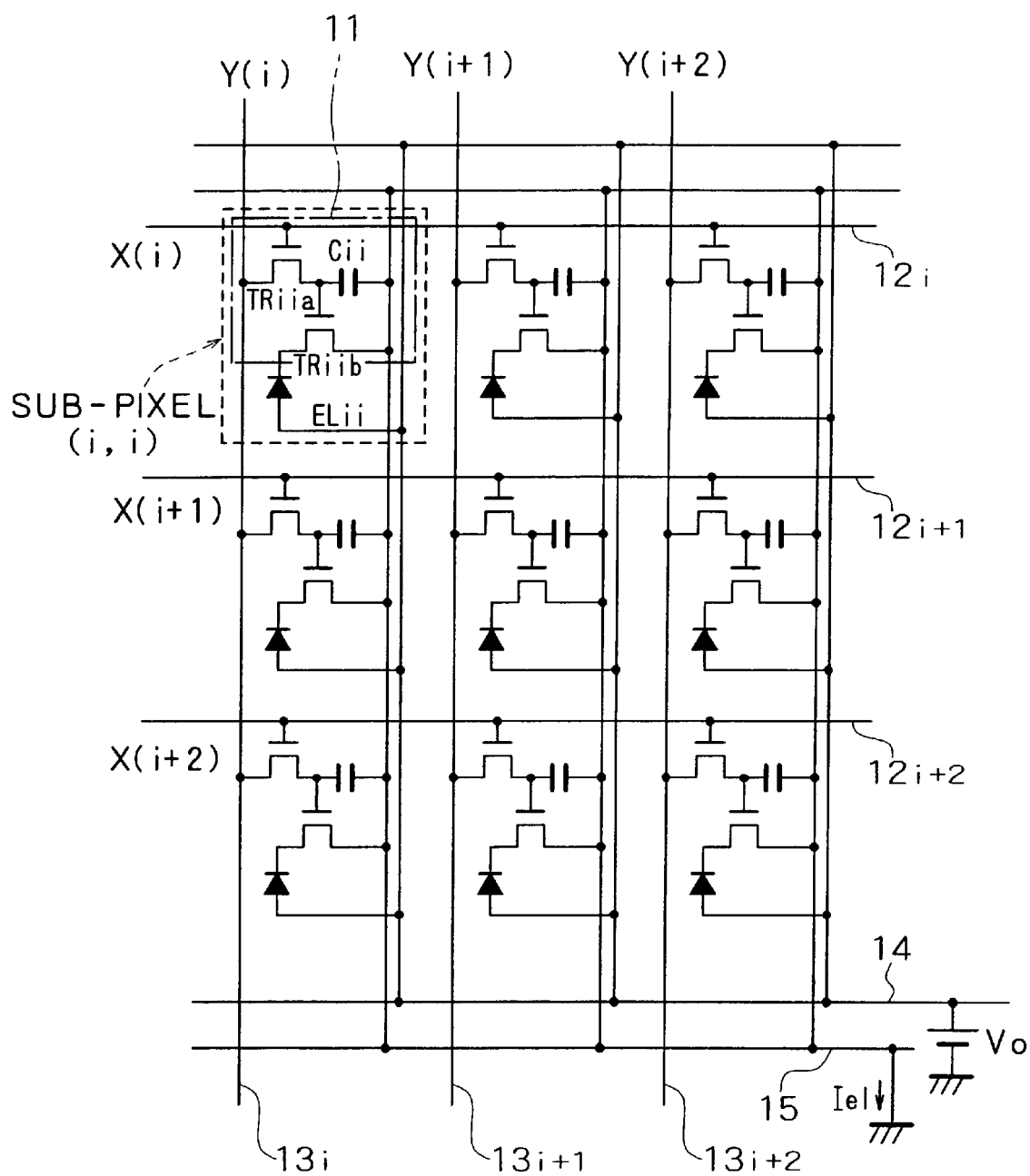
FIG. 3 is a circuit diagram showing a configuration of an active matrix type organic EL apparatus according to an embodiment of the present invention.

Preferred embodiments of the present invention will hereinafter be described in detail with reference to the drawings. FIG. 3 is a circuit diagram showing a configuration of an active matrix type display apparatus according to an embodiment of the present invention, for example an active matrix type organic EL display apparatus.

In FIG. 3, a large number of sub-pixel circuits (hereinafter also referred to simply as sub-pixels) 11 are arranged in a matrix manner to form a display area. In this case, a sub-pixel arrangement of three rows from i row to i+2 row and three columns from i column to i+2 column is shown as an example for simplicity of the figure. This display area is provided with scanning lines 12$i$ to 12$i$+2 that are sequentially supplied with scanning signals 2X(i) to X(i+2) for the sub-pixel circuits 11 and thereby select each of the sub-pixels by a row unit, and data lines (signal lines) 13$i$ to 13$i$+2 that supply pieces of image data, for example, brightness data Y(i) to Y(i+2) to the sub-pixels.

Description below will be made by taking a sub-pixel (i, i) of i row and i column as a sub-pixel circuit 11. However, sub-pixel circuits of other sub-pixels have an identical circuit configuration. An organic EL device ELii is used as a display device, and a TFT (Thin Film Transistor) is used as a sub-pixel transistor. It is to be noted that the sub-pixel circuit 11 is not limited to this circuit example.

The sub-pixel circuit 11 is formed with a selection transistor TRiia for selecting the sub-pixel, a retaining capacitance Cii for retaining a data voltage, and a driving transistor TRiib for driving the organic EL device ELii. The brightness data is supplied from the data line 13$i$ in the form of a voltage, and thus a current corresponding to the data voltage flows through the organic EL device ELii.

As for specific connecting relation, an anode of the organic EL device ELii is connected to a common power supply line (supply voltage Vo) 14. The driving transistor TRiib is connected between a cathode of the organic EL device ELii and a common ground line 15. The retaining capacitance Cii is connected between a gate of the driving transistor TRiib and the common ground line 15. The selection transistor TRiia is connected between the data line 13$i$ and the gate of the driving transistor TRiib, and a gate of the selection transistor TRiia is connected to the scanning line 12$i$.

A structure of the organic EL device will be described in the following with reference to FIG. 4. The organic EL device is formed by creating a first electrode (for example anode electrode) 22 made of a transparent conductive film on a substrate 21 made of a transparent glass or the like, and by further creating thereon an organic layer 27 by depositing a hole carrying layer 23, a light emitting layer 24, an electron carrying layer 25, and an electron injection layer 26 in that order. Then, a second electrode (for example cathode electrode) 28 made of a metal of a low work function is formed on the organic layer 27.

By applying a direct-current voltage E between the first electrode 22 and the second electrode 28 in the organic EL device, a hole is injected from the first electrode (anode electrode) 22 through the hole carrying layer 23 into the light emitting layer 24, and an electron is injected from the second electrode (cathode electrode) 28 through the electron carrying layer 25 into the light emitting layer 24. The injected positive and negative carriers bring a fluorescent molecule in the light emitting layer 24 into an excited state, and then light is emitted in the relaxation process of the excited molecule.

Figure 5:
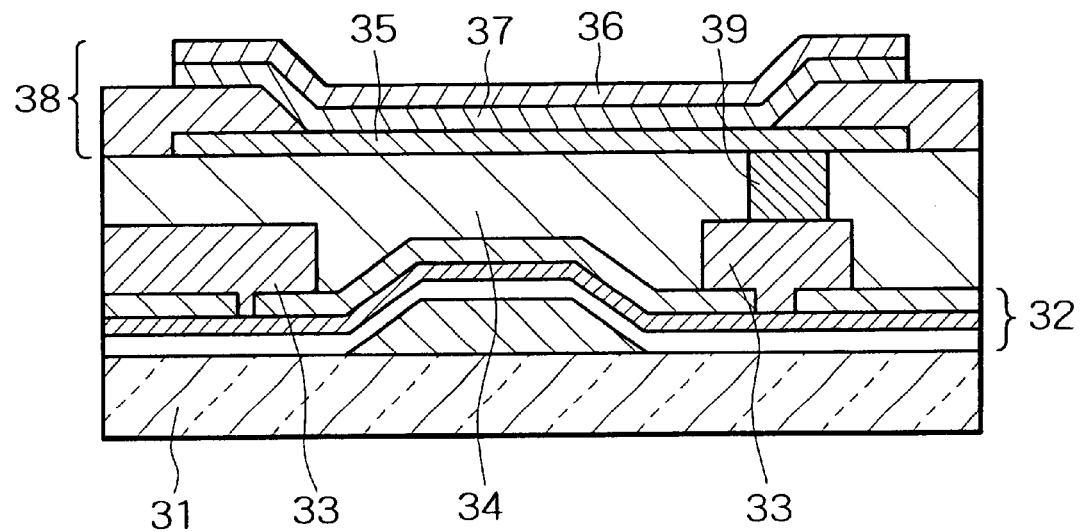
FIG. 5 is a sectional view of a sectional structure of the active matrix type organic EL display apparatus according to the present embodiment.

A sectional structure of the thus formed active matrix type organic EL display apparatus is shown in FIG. 5. FIG. 5 shows an organic EL device forming a certain sub-pixel and its sub-pixel circuit.

In FIG. 5, the sub-pixel circuit (TFT circuit) including a selection transistor TRiia and a driving transistor TRiib as described above is fabricated on a glass substrate 31, thereby forming a circuit layer 32. Also, wiring 33 is formed by patterning, and a flattening film 34 is formed on the wiring 33. Further, an organic EL device formed by sandwiching an organic layer 37 between two electrodes 35 and 36 is fabricated on the flattening film 34, thereby forming a device layer 38.

Figure 4:
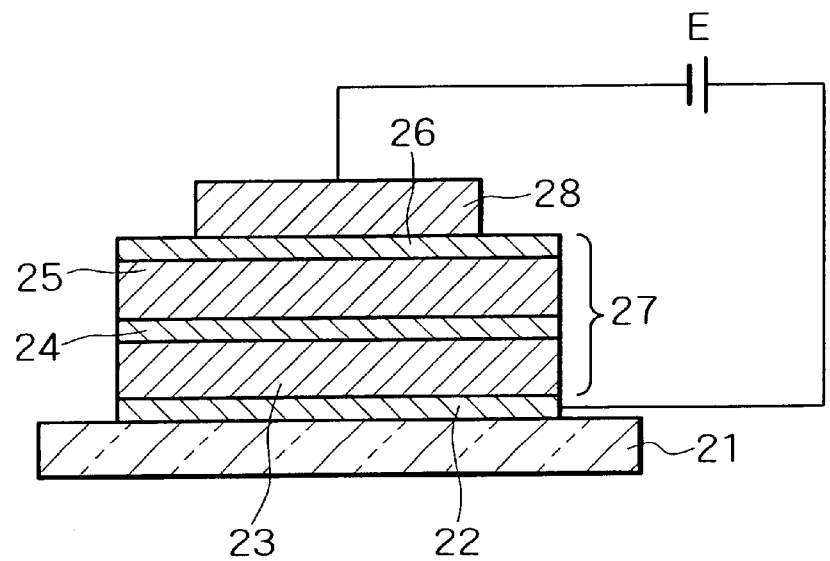
FIG. 4 is a sectional view of a structure of an organic EL device.

In relation to the sectional structure of the organic EL device shown in FIG. 4, the lower electrode 35 corresponds to the first electrode (for example anode electrode) 22; the upper electrode 36 corresponds to the second electrode (for example cathode electrode) 28; and the organic layer 37 corresponds to the organic layer 37 including the light emitting layer 24. The sub-pixel circuit in the circuit layer 32 is electrically connected to the organic EL device in the device layer 38 by a contact portion (connecting portion) 39 formed in the flattening film 34.

A combination of a sub-pixel arrangement of organic EL devices and a sub-pixel arrangement of sub-pixel circuits will be described in the following with reference to plan pattern views of FIGS. 6A, 6B, and 6C.

In the active matrix type organic EL display apparatus according to the present embodiment, the sub-pixel arrangement in the device layer 38 of sub-pixels (organic EL devices) for emitting RGB light is a delta arrangement shown in FIG. 6A, while the sub-pixel arrangement of sub-pixel circuits in the circuit layer 32 is a stripe arrangement shown in FIG. 6B. The sub-pixels in one sub-pixel arrangement are arranged opposite to the sub-pixels in the other sub-pixel arrangement with a one-to-one correspondence as shown in FIG. 6C. An area enclosed by a dotted line in FIGS. 6A and 6C is a light emitting region of each of the sub-pixels.

Thus, when the sub-pixel arrangement of sub-pixels (organic EL devices) is a delta arrangement, and pixels having the delta arrangement are arranged in a staggered manner, a delta-arrangement image is obtained for display. As described above, the delta arrangement has an advantage of providing a high apparent display resolution, and is thus most suitable especially for image display.

In the case of a low-molecular-weight organic EL device, in particular, its organic layer is generally formed by deposition. When an organic EL display apparatus having this organic EL device as a sub-pixel is intended for multi-color or full-color display, the organic EL devices are selectively deposited by using a metal mask or the like, and therefore high-precision deposition techniques are required. Misalignment in deposition results in problems such as no deposition of the organic layer 37 and hence the short-circuiting of the lower electrode 35 and the upper electrode 36, and deposition of the organic layer 37 in an adjacent sub-pixel, which causes mixing of colors or non-emission of light.

In addition, when the deposition accuracy is not sufficient, organic EL devices having a desired sub-pixel pitch cannot be fabricated, and therefore it is not possible to achieve high definition of an organic EL display. Furthermore, the accuracy of depositing the organic layer is generally poor as compared with the accuracy of fabricating electrodes, insulating films and the like. Therefore, even if a display having a certain resolution can be fabricated, accuracy of a sub-pixel is determined by the organic layer. Thus, a decrease in the accuracy of depositing the organic layer results in a decrease in an aperture ratio of the light emitting layer.

Figure 7A:
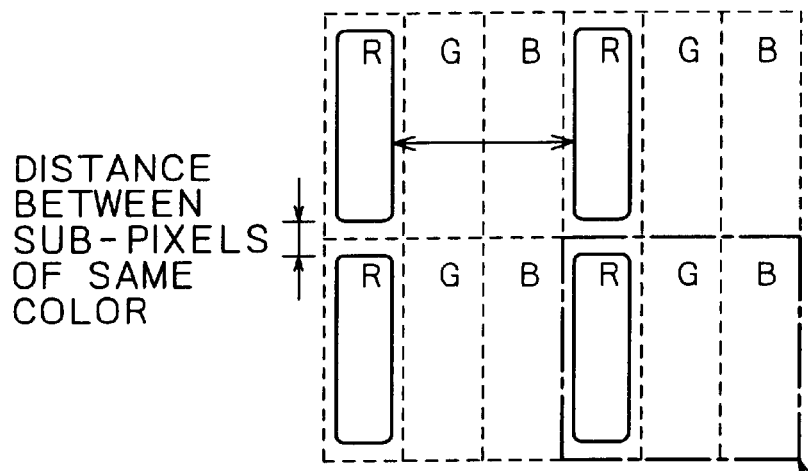
FIGS. 7A and 7B are diagrams showing a difference in inter-sub-pixel distance between a stripe arrangement (A) of organic EL devices and a delta arrangement (B) of organic EL devices.
Figure 7B:
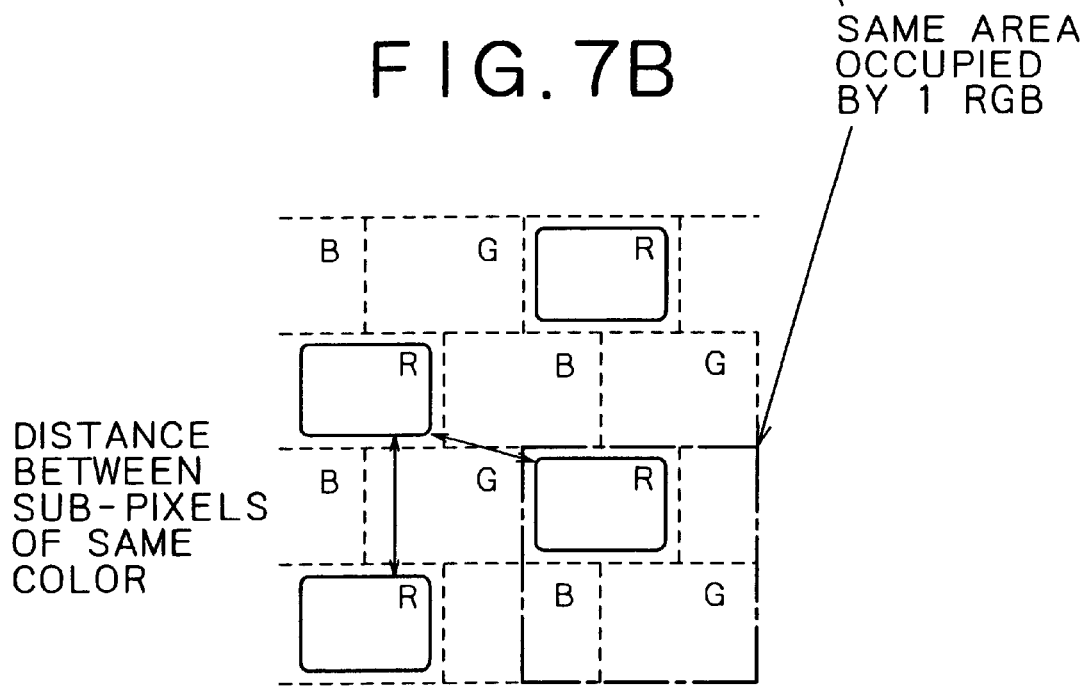

As a measure to deal with this, the organic EL display apparatus according to the present embodiment employs the delta arrangement as the sub-pixel arrangement of sub-pixels (organic EL devices). When an area occupied by one pixel having three adjacent sub-pixels of R, G, and B as a unit is fixed, as is clear from FIGS. 7A and 7B, the sub-pixel shape of one sub-pixel in the delta arrangement (FIG. 7B) is close to a square as compared with the sub-pixel shape of one sub-pixel in the stripe arrangement (FIG. 7A).

Hence, when the organic layer of the organic EL device is formed by deposition, a distance between sub-pixels of the same color can be increased especially in a column direction. Therefore, the delta arrangement (FIG. 7B) provides a larger margin of accuracy of a deposition metal mask than the stripe arrangement (FIG. 7A). When the deposition is made with the same accuracy, the delta arrangement (FIG. 7B) makes it possible to achieve a higher aperture ratio than the stripe arrangement (FIG. 7A).

As shown in FIG. 8A, the shape of an aperture of a metal mask in the case of the stripe arrangement (FIG. 7A) is a long and narrow rectangle (slit shape) corresponding to a sub-pixel of rectangular shape. On the other hand, as shown in FIG. 8B, the shape of an aperture of a metal mask in the case of the delta arrangement (FIG. 7B) is closer to a square corresponding to the shape of a sub-pixel.

When directing attention to an oblique component of particles flying from a deposition source, an eclipse by the rectangular mask (FIG. 8A) having a long and narrow aperture shape is large, and therefore the mask is weak with respect to the oblique component of the deposition. The large eclipse by the mask degrades film thickness distribution within the sub-pixel, thus resulting in lower reliability of the organic EL device. On the other hand, an eclipse by the mask (FIG. 8B) having a substantially square aperture shape is small, and therefore the mask is strong with respect to the oblique component of the deposition. Thus, film thickness distribution within the sub-pixel can be made uniform.

With recent increases in resolution of displays, deposition masks become larger and thickness of the deposition masks tends to be increased for stiffness. Increased thickness of the deposition masks further enlarges the eclipse by the mask. Thus, also from a viewpoint of rendering the film thickness distribution within the sub-pixel uniform, the delta arrangement is more advantageous as the sub-pixel arrangement of sub-pixels than the stripe arrangement.

As is clear from the above description, use of the delta arrangement (FIG. 7B) as the sub-pixel arrangement of sub-pixels enables higher-precision deposition of an organic EL device than use of the stripe arrangement (FIG. 7A). In addition, since the organic EL device can be improved in reliability and reduced in size, it is possible to realize a high-reliability, high-definition, and high-brightness organic EL display.

On the other hand, use of the stripe arrangement as the sub-pixel arrangement of sub-pixel circuits eliminates the need for bending wiring along the sub-pixel arrangement as in the case of the delta arrangement, thus making it possible to simplify the configuration of the wiring. As a result, reliability of the sub-pixel circuits can be enhanced. The light emitting region of a light emitting device does not need to be a quadrilateral; the light emitting region of a light emitting device may be a hexagon as shown in FIG. 9A, for example.

Figure 10:
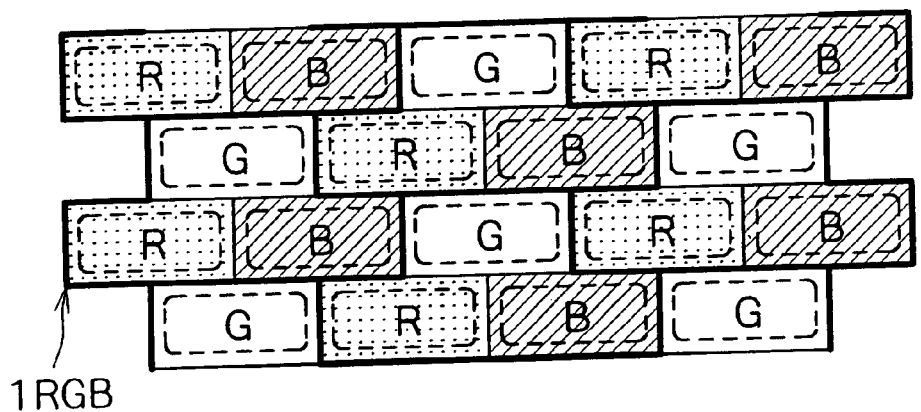
FIG. 10 is a diagram showing a delta arrangement of organic EL devices.

As shown in FIG. 10, sub-pixels of pixels (RGB) enclosed by thick lines in the delta arrangement according to the foregoing embodiment, that is, sub-pixels of the same emitting color are not adjacent to each other. Also, the delta arrangement is a pixel arrangement that arranges pixels in a staggered manner, each of the pixels having three sub-pixels of three different colors whose center positions are adjacent to one another, forming a triangle. In order to obtain a proper image from a data signal when the sub-pixel arrangement of sub-pixel circuits is the stripe arrangement with the above delta arrangement, scanning lines and data lines need to be routed in a complex manner along the delta sub-pixel arrangement, or the data signal needs to be converted into a data signal for the delta arrangement by a driving system.

As a problem of the delta arrangement, there is a phase difference in a column direction of ½ of a sub-pixel between sub-pixels adjacent to each other in a row direction. Therefore, with the delta arrangement, it is difficult to make accurate image display of a straight line in a vertical direction. Accordingly, a display for use as a PC (personal computer) monitor requiring character display generally uses the stripe arrangement.

Figure 11:
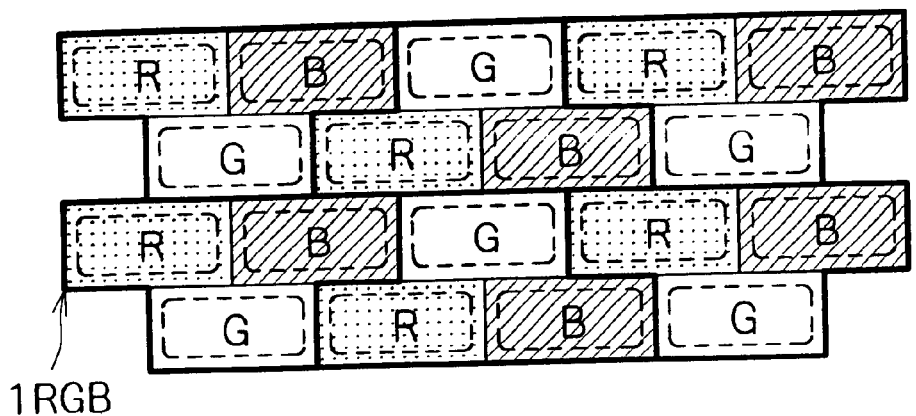
FIG. 11 is a diagram showing a modification of the delta arrangement of organic EL devices.

FIG. 11 shows a modification of the delta arrangement. Pixels (RGB) enclosed by thick lines in the delta arrangement according to the modification are arranged in a stripe manner. More specifically, the delta arrangement is a pixel arrangement in which a normal and an inverted delta shape, or triangles whose tops and bottoms are inverted with respect to each other, are arranged alternately within two sub-pixel rows. In display, pixels adjacent to each other in a row direction in the delta arrangement are arranged at the same position as in the stripe arrangement.

Thus, since the arrangement of organic EL devices is the delta arrangement, a distance between metal masks for the same color can be increased. Therefore, high-precision deposition is possible, thereby resulting in an improvement in reliability of the organic EL devices and a reduction in size of the organic EL devices. In addition, since pixels (RGB) in the delta arrangement are arranged in a stripe manner, the organic EL devices can be driven in the same manner as in the stripe arrangement. Consequently, the modification enables more accurate character display than the delta arrangement of FIG. 10.

Thus, it is not necessary to route scanning lines and data lines in a complex manner or convert the data signal into a data signal for the delta arrangement by a driving system as in the case of driving organic EL devices in the delta arrangement. It is therefore possible to fabricate a high-reliability and high-definition organic EL display more suitable for character display than that using the delta arrangement, with simple wiring and a simple driving system.

When the sub-pixel arrangement of sub-pixel circuits is the stripe arrangement and the sub-pixel arrangement of light emitting portions is the delta arrangement as in the active matrix type organic EL display apparatus according to the present embodiment, the following configuration is obtained. Generally, as shown in FIG. 12, contact portions 39 are formed in a straight line between rows, and then a sub-pixel circuit in the circuit layer 32 is electrically connected to a corresponding organic EL device in the device layer 38 via the contact portion 39.

Figure 12:
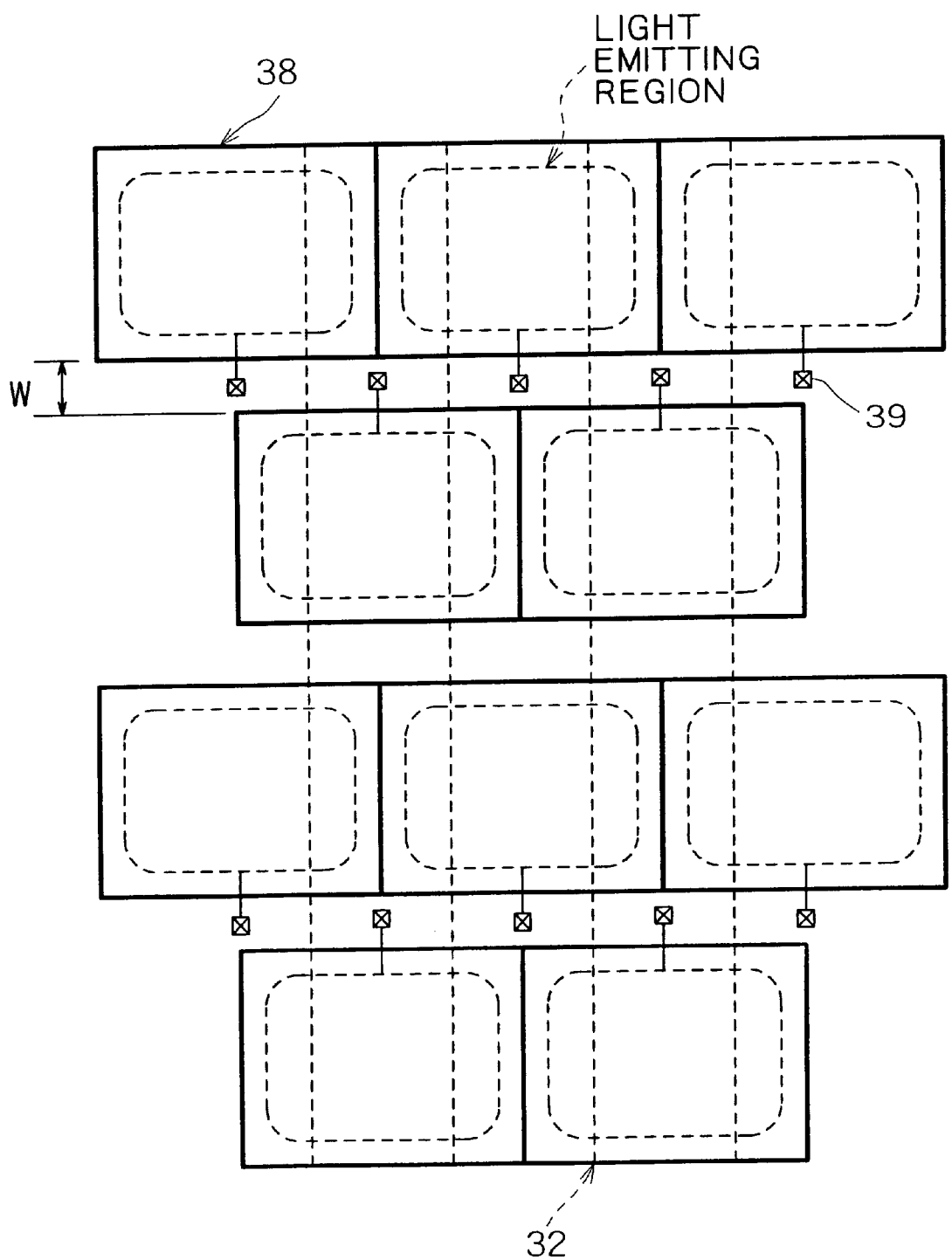
FIG. 12 is a diagram of assistance in explaining a problem involved in forming contact portions.

In FIG. 12, an area indicated by a solid line denotes a light emitting portion (sub-pixel), and an area indicated by a broken line denotes a light emitting region. In order to arrange contact portions 39 in a straight line between rows, a zone of width W for forming the contact portions 39 between rows needs to be secured. This prevents a sub-pixel pitch in a column direction (vertical direction) from being set small. On the other hand, in order to secure a certain sub-pixel pitch, the area of the light emitting region (hereinafter referred to as light emitting area) needs to be reduced.

In order to solve the above problems involved in forming the contact portions 39, the present invention employs the following configurations. The configurations for forming the contact portions 39 for electrically connecting sub-pixel circuits in the circuit layer 32 to organic EL devices in the device layer 38 will be described in the following by taking a few examples.

[First Configuration]

Figure 13:
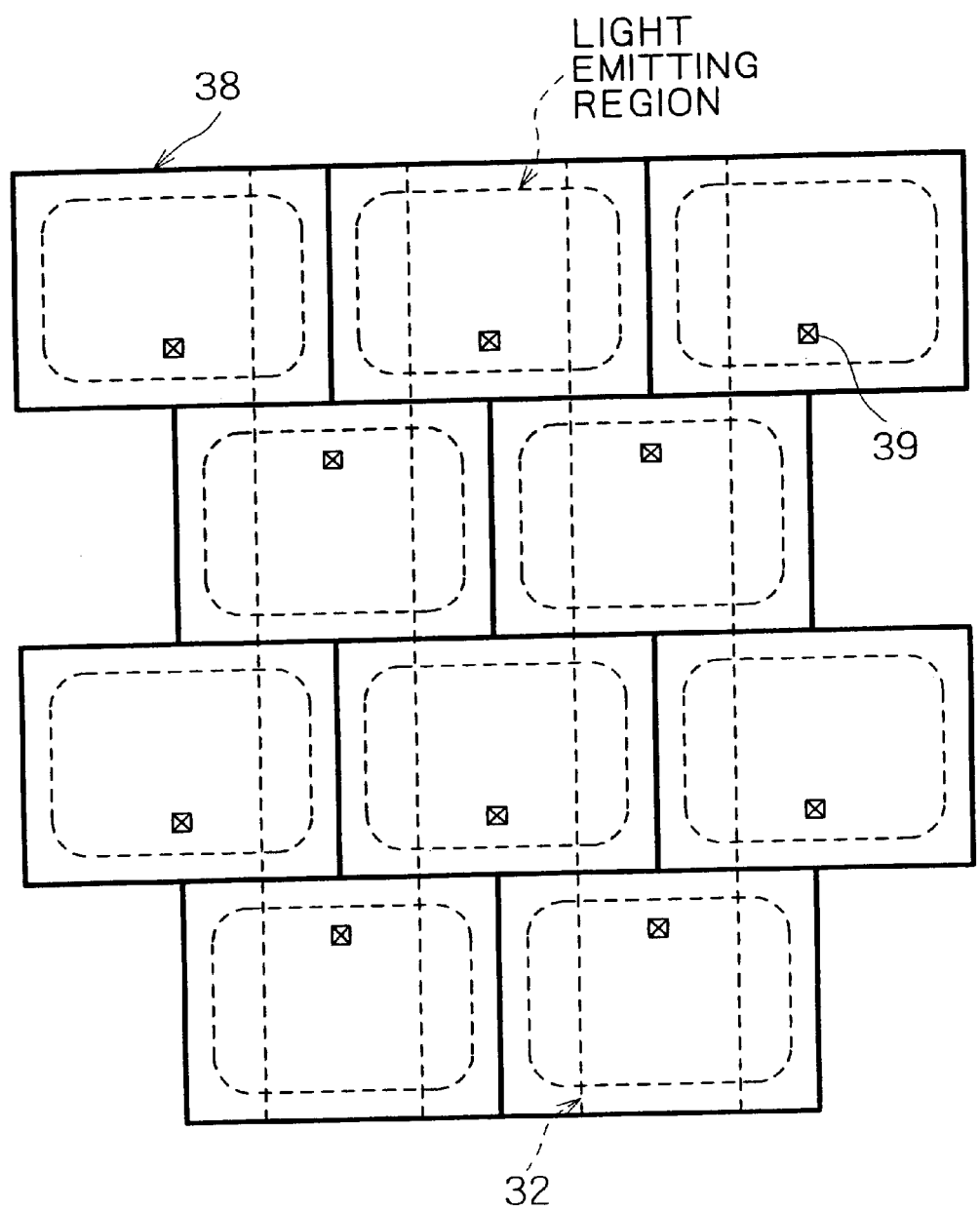
FIG. 13 is a diagram showing a first configuration of formation of contact portions.

A first configuration takes contact portions 39 in two sub-pixels of the sub-pixel circuits adjacent to each other in a row direction as a unit. The contact portions 39 are arranged in a manner staggered in a vertical direction at positions that differ from each other between the two sub-pixels, with an inter-row boundary line intermediate between the contact portions 39, as shown in FIG. 13, for example. This configuration is the same as that shown in FIG. 6C. As is clear from FIG. 6C, the position of the contact portion 39 differs between two sub-pixels adjacent to each other in a direction of a scanning line (row direction), that is, between an R sub-pixel and a G sub-pixel, between the G sub-pixel and a B sub-pixel, and between the B sub-pixel and an R sub-pixel; thus the contact portions 39 are arranged in a manner staggered in a vertical direction with an inter-row boundary line intermediate between the contact portions 39.

The active matrix type organic EL display apparatus having the first configuration takes contact portions 39 in two sub-pixels of the sub-pixel circuits adjacent to each other in the row direction as a unit, and arranges the contact portions 39 at positions that differ from each other between the two sub-pixels, thereby eliminating the need for securing a zone between rows for arranging the contact portions 39. Thus, it is possible to correspondingly increase the light emitting area and set the sub-pixel pitch in the vertical direction smaller.

[Modification of First Configuration]

Figure 14:
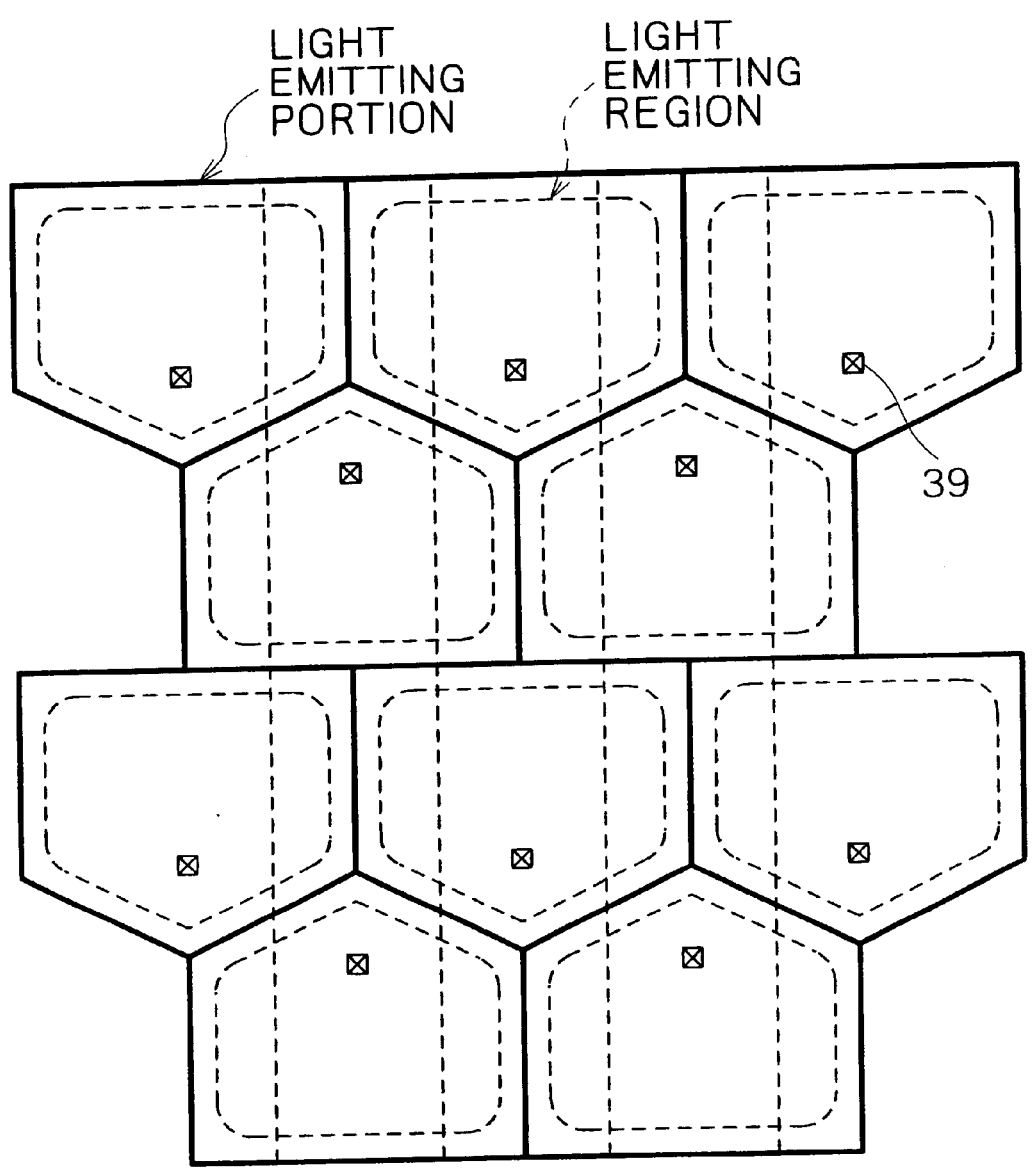
FIG. 14 is a diagram showing a modification of the first configuration.

There is a configuration conceivable as a modification of the first configuration, in which light emitting portions and light emitting regions are shaped into pentagons, and projecting parts of the light emitting portions in two adjacent rows are engaged with each other, as shown in FIG. 14. In this case, contact portions 39 are arranged in the projecting parts of the light emitting regions, as shown in FIG. 14. Also in this case, contact portions 39 in two sub-pixels of the sub-pixel circuits are taken as a unit, and the contact portions 39 are arranged at positions that differ from each other between the two sub-pixels.

Thus, by shaping the light emitting portions and light emitting regions into pentagons and arranging the contact portions 39 in the projecting parts of the light emitting regions, a substantially rectangular region of the pentagonal light emitting region other than the projecting part can be obtained as a region that actually contributes to light emission (hereinafter referred to as an actual light emitting region). Therefore, the light emitting area can be increased. Specifically, a part for forming a contact portion 39 has a difference in level, and is a region that does not contribute to light emission; therefore, when the light emitting portions and light emitting regions are shaped into rectangles as shown in FIG. 13, the rectangular region does not form the actual light emitting region in its shape, and the actual light emitting region is reduced by an area of the part for forming the contact portion 39.

In the case of the present modification, the light emitting portions and light emitting regions are shaped into pentagons, and the contact portions 39 are arranged in the projecting parts of the light emitting regions. In other words, by arranging a contact portion 39 outside a determined light emitting region (a rectangular region shown in FIG. 13 in this case) of the light emitting portion, a region that does not contribute to light emission is only the projecting part. Hence, a region of the same size as the rectangular region shown in FIG. 13 can be obtained as an actual light emitting region, thereby making it possible to increase the light emitting area.

The above configuration and its modification specify only the position of the contact portion 39, and do not specifically limit the layout of circuit devices such as TFTs forming the sub-pixel circuits. When the layout of circuit devices differs between sub-pixels, however, characteristics of the sub-pixel circuit can generally vary between the sub-pixels.

[Second Configuration]

Figure 15A:
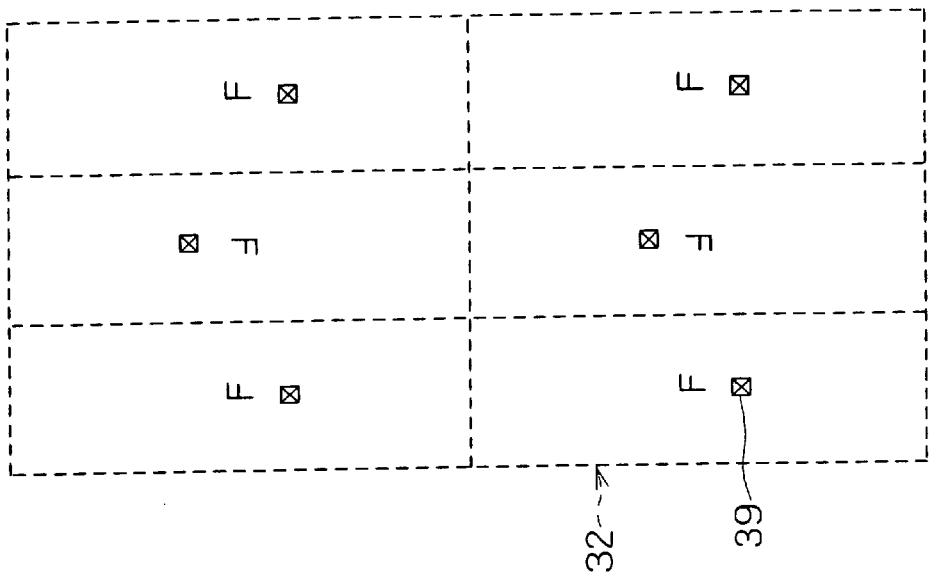
FIGS. 15A and 15B are diagrams showing a second configuration of formation of contact portions.

As shown in FIG. 15A, a second configuration takes contact portions 39 in two sub-pixels (F, F') adjacent to each other in a row direction as a unit, and arranges the contact portions 39 in a manner staggered in a vertical direction at positions different from each other between the two sub-pixels (F, F'). Also, the second configuration has the same (fixed) layout of circuit devices such as TFTs forming the sub-pixel circuits between sub-pixels. Incidentally, FIG. 15A shows only the shape of sub-pixels in a circuit layer 32 and contact portions 39 for connection to light emitting portions. F and F' indicates that only the position of the contact portion 39 differs between F and F', and the layout of the circuit devices is the same between F and F'.

Thus, only the contact portions 39 in two sub-pixels adjacent to each other in a row direction are taken as a unit, and only the contact portions 39 are arranged at positions different from each other between the two sub-pixels. On the other hand, the layout of circuit devices such as TFTs forming the sub-pixel circuits is made to be the same between sub-pixels. It is thus possible to increase the light emitting area by the setting of the position of the contact portions 39 and optimize the light emitting region. Also, it is possible to minimize variation in characteristics of the sub-pixel circuits between sub-pixels caused by the layout of circuit devices, and thus realize a sub-pixel circuit unit having uniform characteristics.

[Modification of Second Configuration]

Figure 15B:
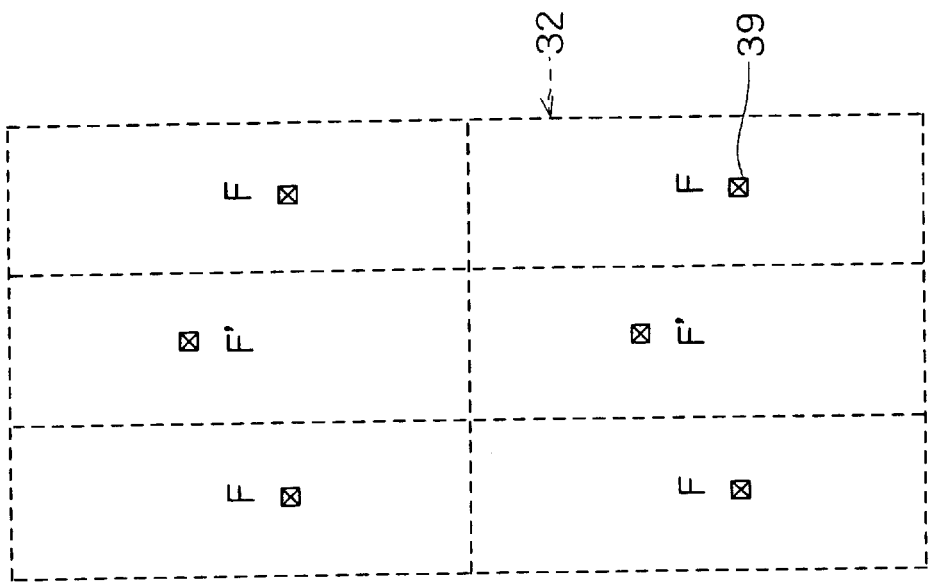

As shown in FIG. 15B, a modification has the same (fixed) layout of circuit devices such as TFTs forming sub-pixel circuits between sub-pixels, arranges a contact portion 39 at a position displaced from the center of the sub-pixel circuit, and inverts such a sub-pixel circuit in one of two sub-pixels adjacent to each other in a row direction. Thus, the layout of circuit devices is the same between sub-pixels, only the contact portions 39 in two sub-pixels adjacent to each other in the row direction are taken as a unit, and only the contact portions 39 are arranged in a manner staggered in a vertical direction in the two sub-pixels.

Also in the case of the present modification, it is possible to increase the light emitting area by the setting of the position of the contact portions 39 and optimize the light emitting region. In addition, it is possible to minimize variation in characteristics of the sub-pixel circuits between sub-pixels caused by the layout of circuit devices, and thus realize a sub-pixel circuit unit having uniform characteristics. In particular, when the circuit configuration of a sub-pixel circuit uses only one scanning line, the scanning line can be routed in the middle of the sub-pixel circuit in the row direction.

[Third Configuration]

A third configuration has the same (fixed) layout of circuit devices such as TFTs forming sub-pixel circuits between sub-pixels, has the same position of contact portions 39 with respect to the sub-pixel circuits between sub-pixels, and displaces in a column direction a sub-pixel circuit of one of two sub-pixels adjacent to each other in a row direction, as shown in FIG. 16A. Thus, only the contact portions 39 in two sub-pixels adjacent to each other in the row direction are taken as a unit, and arranged in a manner staggered in a vertical direction in the two sub-pixels.

Also in the case of the present configuration, it is possible to increase the light emitting area by the setting of the position of the contact portions 39 and optimize the light emitting region. In addition, it is possible to minimize variation in characteristics of the sub-pixel circuits between sub-pixels caused by the layout of circuit devices, and thus realize a sub-pixel circuit unit having uniform characteristics. Similar effects can be obtained by a configuration in which a sub-pixel circuit of one of two sub-pixels adjacent to each other in a row direction is inverted and displaced in a column direction, as shown in FIG. 16B.

[Fourth Configuration]

Figure 17:
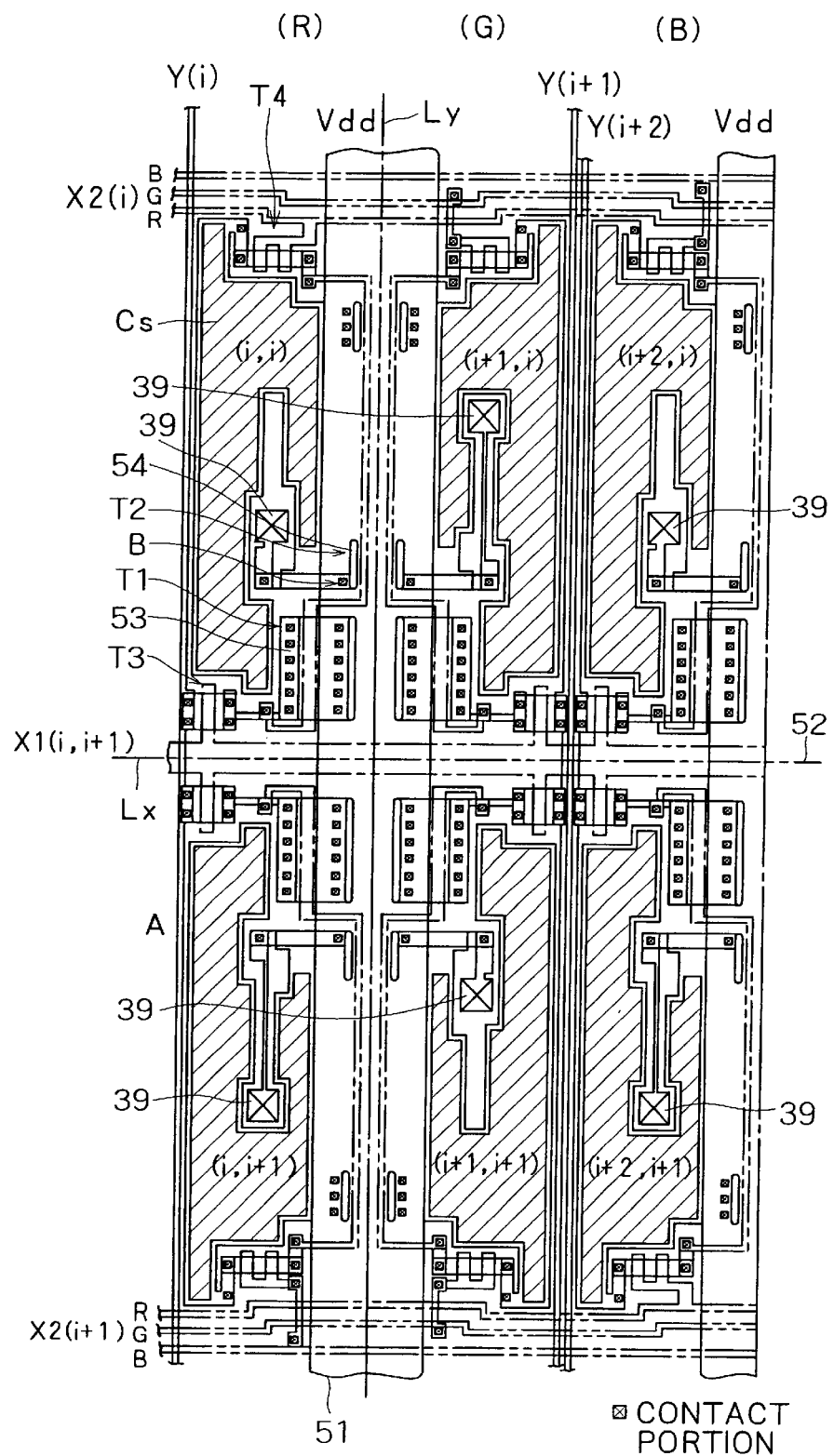
FIG. 17 is a layout pattern diagram showing a fourth configuration of formation of contact portions.

FIG. 17 is a pattern diagram showing a layout according to a fourth configuration. FIG. 17 shows an actual example of a layout in which a sub-pixel circuit is formed by a current writing type sub-pixel circuit shown in FIG. 18.

Figure 18:
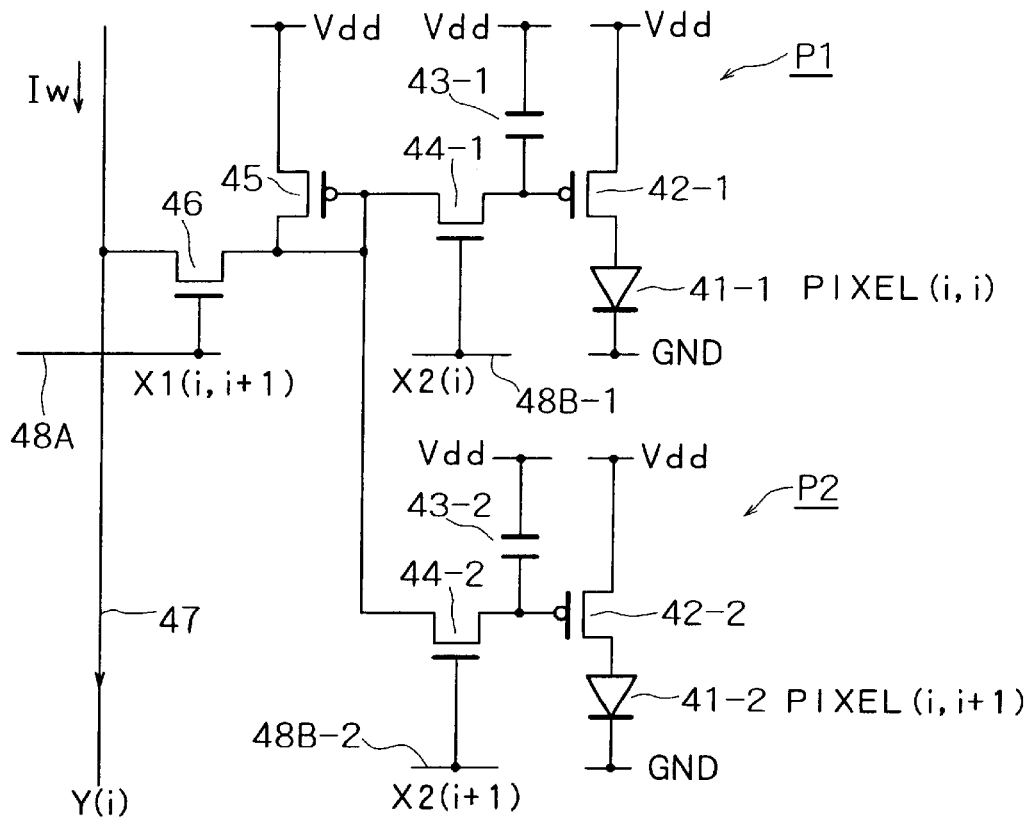
FIG. 18 is a circuit diagram showing a configuration of a current writing type sub-pixel circuit.

Circuit configuration of the current writing type sub-pixel circuit will first be described. FIG. 18 shows only sub-pixel circuits P1 and P2 of two sub-pixels (i, i) and (i, i+1) in an i-th row and an (i+1)-th row adjacent to each other in an i-th column, for simplicity of the figure.

The sub-pixel circuit P1 of the sub-pixel (i, i) in FIG. 18 includes: an organic EL device 41-1 having a cathode connected to a first power supply (ground in this case); a TFT 42-1 having a drain connected to an anode of the organic EL device 41-1 and a source connected to a second power supply (positive power supply Vdd in this case); a capacitor 43-1 connected between a gate of the TFT 42-1 and the positive power supply Vdd; and a TFT 44-1 having a drain connected to the gate of the TFT 42-1 and a gate connected to a scanning line 48B-1.

Similarly, the sub-pixel circuit P2 of the sub-pixel (i, i+1) includes: an organic EL device 41-2 having a cathode connected to the ground; a TFT 42-2 having a drain connected to an anode of the organic EL device 41-2 and a source connected to the positive power supply Vdd; a capacitor 43-2 connected between a gate of the TFT 42-2 and the positive power supply Vdd; and a TFT 44-2 having a drain connected to the gate of the TFT 42-2 and a gate connected to a scanning line 48B-2.

The sub-pixel circuits P1 and P2 for two sub-pixels have in common: a so-called diode-connected TFT 45 having a drain and a gate electrically short-circuited; and a TFT 46 connected between the TFT 45 and a data line 47. Specifically, the drain and the gate of the TFT 45 are connected to a source of the TFT 44-1 of the sub-pixel circuit P1 and a source of the TFT 44-2 of the sub-pixel circuit P2, while a source of the TFT 45 is connected to the positive power supply Vdd. The TFT 46 has a drain connected to the drain and the gate of the TFT 45, a source connected to the data line 47, and a gate connected to a scanning line 48A.

In this circuit example, a p-channel MOS transistor is used as the TFT 42-1, the TFT 42-2, and the TFT 45, and an n-channel MOS transistor is used as the TFT 44-1, the TFT 44-2, and the TFT 46. However, the TFTs are not limited to the above conduction types.

The TFT 46 in the thus formed sub-pixel circuits P1 and P2 has a function as a first scanning switch for selectively supplying the TFT 45 with a current Iw provided from the data line 47. The TFT 45 has a function as a converter unit for converting the current Iw provided from the data line 47 via the TFT 46 into a voltage, and also forms a current mirror circuit in conjunction with the TFTs 42-1 and 42-2. The TFT 45 can be shared between the sub-pixel circuits P1 and P2 because the TFT 45 is used only at the instant of writing the current Iw.

The TFTs 44-1 and 44-2 have a function as a second scanning switch for selectively supplying the capacitors 43-1 and 43-2 with the voltage obtained by converting the current Iw by the TFT 45. The capacitors 43-1 and 43-2 have a function as a retaining unit for retaining the voltage obtained by converting the current Iw by the TFT 45 and supplied via the TFTs 44-1 and 44-2. The TFTs 42-1 and 42-2 have a function as a driving unit for driving the organic EL devices 41-1 and 41-2 for light emission by converting the voltage retained by the capacitors 43-1 and 43-2 into a current and supplying the current to the organic EL devices 41-1 and 41-2.

Operation of writing brightness data in the thus formed current writing type sub-pixel circuits will be described in the following.

The writing of the brightness data to the sub-pixel (i, i) will be considered first. The current Iw corresponding to the brightness data is supplied to the data line 47 in a state in which the scanning lines 48A and 48B-1 are both selected. The current Iw is supplied to the TFT 45 via the TFT 46 in a conducting state. In response to the current Iw flowing to the TFT 45, a voltage corresponding to the current Iw is generated at the gate of the TFT 45. The voltage is supplied to the capacitor 43-1 via the TFT 44-1 in a conducting state, and then retained by the capacitor 43-1.

Then, a current corresponding to the voltage retained by the capacitor 43-1 flows through the TFT 42-1 to the organic EL device 41-1. The organic EL device 41-1 thereby begins to emit light. When the scanning lines 48A and 48B-1 are brought into a non-selected state, the operation of writing the brightness data to the sub-pixel (i, i) is completed. During the series of operation steps, the scanning line 48B-2 is in a non-selected state, and therefore the organic EL device 41-2 of the sub-pixel (i, i+1) is emitting light at a brightness corresponding to a voltage retained by the capacitor 43-2. Thus, the operation of writing to the sub-pixel (i, i) produces no effects on the light emitting state of the organic EL device 41-2.

The writing of the brightness data to the sub-pixel (i, i+1) will be considered next. The current Iw corresponding to the brightness data is supplied to the data line 47 in a state in which the scanning lines 48A and 48B-2 are both selected. In response to the current Iw flowing to the TFT 45 via the TFT 46, a voltage corresponding to the current Iw is generated at the gate of the TFT 45. The voltage is supplied to the capacitor 43-2 via the TFT 44-2 in a conducting state, and then retained by the capacitor 43-2.

Then, a current corresponding to the voltage retained by the capacitor 43-2 flows through the TFT 42-2 to the organic EL device 41-2. The organic EL device 41-2 thereby begins to emit light. During the series of operation steps, the scanning line 48B-1 is in a non-selected state, and therefore the organic EL device 41-1 of the sub-pixel (i, i) is emitting light at a brightness corresponding to the voltage retained by the capacitor 43-1. Thus, the operation of writing to the sub-pixel (i, i+1) produces no effects on the light emitting state of the organic EL device 41-1.

An actual example of a layout using the thus formed current writing type sub-pixel circuits will next be described with reference to the pattern diagram of FIG. 17.

In this layout example, sub-pixel circuits of two sub-pixels (i, i) and (i+1, i) adjacent to each other in a row direction (scanning line direction) are taken as a set, and circuit devices forming the sub-pixel circuits of the two sub-pixels, TFTs and their wiring pattern in particular, are symmetrical with respect to a boundary line between the columns. As for contact portions 39 for electrically connecting organic EL devices in a device layer to sub-pixel circuits, contact portions 39 of the two sub-pixels forming the set are taken as a unit, and arranged at different positions in the sub-pixel circuits in such a manner as to be staggered in a vertical direction in the two sub-pixels, as in the first to third configurations described above.

For correspondence between circuit devices in the layout pattern diagram of FIG. 17 and circuit devices of the sub-pixel circuit P1 of the sub-pixel (i, i) in the sub-pixel circuit diagram of FIG. 18, T1 corresponds to the TFT 45; T2 corresponds to the TFT 42-1; T3 corresponds to the TFT 46; T4 corresponds to the TFT 44-1; and Cs (hatched region) corresponds to the capacitor 43-1.

As is clear from FIG. 17, the layouts of circuit devices in the sub-pixel circuits of the two sub-pixels (i, i) and (i+1, i) adjacent to each other in the row direction (right-and-left direction of the figure) are formed so as to be symmetrical with respect to a boundary line Ly between the columns, except for the contact portions 39 arranged in such a manner as to be staggered in units of two sub-pixels. In addition, the layouts of circuit devices in the sub-pixel circuits of two sub-pixels (i, i) and (i, i+1) adjacent to each other in a column direction (top-and-bottom direction of the figure) that is, the sub-pixel circuits in two adjacent rows are formed so as to be symmetrical with respect to a boundary line Lx between the rows, except for the contact portions 39.

In the layout pattern of the sub-pixels, two sub-pixels adjacent to each other in the row direction are taken as a unit, and a power supply (Vdd) line 51 is routed along the boundary line Ly between the two sub-pixels, that is, between the sub-pixel (i, i) and the sub-pixel (i+1, i) and between the sub-pixel (i, i+1) and the sub-pixel (i+1, i+1) in the example of FIG. 17. The power supply line 51 is shared between the two sub-pixels adjacent to each other in the row direction. This configuration allows a single power supply line to be routed as a power supply line for two columns, and thus enables wiring width of the power supply line 51 to be set large, as is clear from FIG. 17.

With two sub-pixels adjacent to each other in a column direction taken as a unit, a scanning line 52 of X1(i, i+1) is routed along the boundary line Lx between the two sub-pixels, that is, between the sub-pixel (i, i) and the sub-pixel (i, i+1), between the sub-pixel (i+1, i) and the sub-pixel (i+1, i+1), and between a sub-pixel (i+2, i) and a sub-pixel (i+2, i+1) in the example of FIG. 17. The scanning line 52 is shared between the two sub-pixels adjacent to each other in the column direction, whereby the TFT 46 in the sub-pixel circuits of FIG. 18, that is, the transistor T3 in FIG. 17 is shared between the two sub-pixels.

Figure 19:
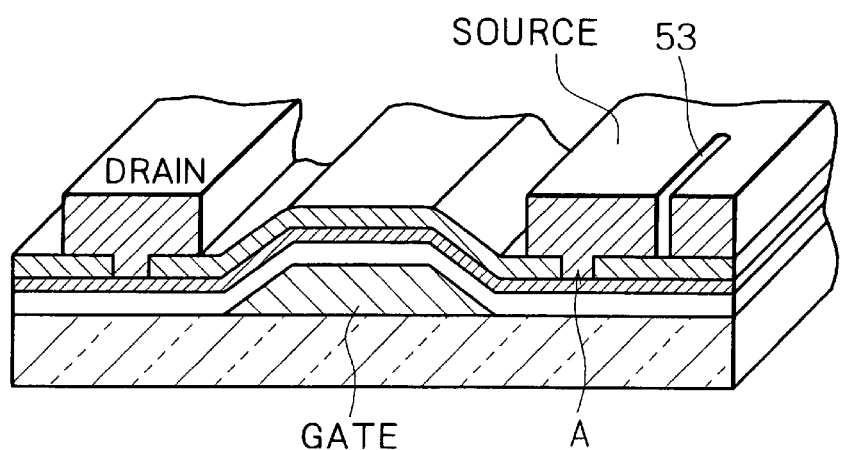
FIG. 19 is a perspective view of structure of a transistor having a slit in the vicinity of a contact portion.

Slits 53 and 54 extending in a direction of a wiring pattern having a large area, for example the wiring pattern of the power supply line 51 are formed in the vicinity of a contact portion A of a source of the transistor T1 (TFT 45 in FIG. 18) and a contact portion B of a source of the transistor T2 (TFT 42-1 in FIG. 18) that are present in the wiring pattern. FIG. 19 shows a structure of the transistor T1 having the slit 53 in the vicinity of the contact portion A, for example. Effects of the slit 53 or 54 will be described in the following.

If there is a wiring pattern having a large region (area), or the wiring pattern of the power supply line 51 in this case, at the side of the transistor T1, a wiring material (for example aluminum) may be diffused to the transistor side when heat is applied in a manufacturing stage, which can result in destruction of the transistor. A supply source of the wiring material diffused to the transistor side can be reduced by forming the slit 53 in the vicinity of the contact portion A of the transistor T1. As a result, it is possible to control the diffusion of the wiring material to the transistor side, and thus prevent the destruction of the transistor in a manufacturing stage. Furthermore, since the slit 53 or 54 is formed in the wiring direction of the wiring pattern of the power supply line 51, it is possible to minimize an increase in wiring resistance involved in forming the slit.

As described above, the foregoing configurations take contact portions 39 of two sub-pixels as a unit, and arrange the contact portions 39 at different positions in sub-pixel circuits in such a manner as to be staggered in a vertical direction in the two sub-pixels. This makes it possible to increase light emitting area, that is, aperture ratio, and thus achieve a higher brightness of the active matrix type organic EL display apparatus. In addition, since characteristics between sub-pixel circuits can be made uniform, it is possible to achieve higher quality of the active matrix type organic EL display apparatus.

It is to be noted that while applications of the foregoing embodiments to an active matrix type organic EL display apparatus using an organic EL device as a light emitting device of a sub-pixel circuit have been described as examples, the present invention is not limited to these applications, and is applicable to active matrix type display apparatus in general formed by stacking a device layer including a light emitting layer on a circuit layer.

As described above, when stacking, on a substrate, a device layer formed by arranging a light emitting portion in a sub-pixel unit and a circuit layer formed by arranging a sub-pixel circuit for driving a light emitting device of the light emitting portion in the sub-pixel unit, the active matrix type display apparatus according to the present invention has a stripe arrangement as the sub-pixel arrangement of sub-pixel circuits and a delta arrangement as the sub-pixel arrangement of light emitting devices. Therefore, it is possible to improve reliability of the sub-pixel circuits while utilizing the advantages of the delta arrangement of the light emitting devices, and thus realize a high-reliability, high-definition, and high-brightness display apparatus.

What is claimed is:

1. An active matrix type display apparatus formed by stacking, on a substrate, a device layer formed by arranging a an organo-electroluminescent light emitting portion in a sub-pixel unit and a circuit layer formed by arranging a sub-pixel circuit for driving an organo-electroluminescent light emitting device of said light emitting portion in the sub-pixel unit, said active matrix type display apparatus comprising: a stripe-shaped sub-pixel arrangement in which said sub-pixel circuits exist on straight lines in both a row direction and a column direction; and a delta sub-pixel arrangement in which said light emitting portions have twice a sub-pixel pitch in the row direction of said sub-pixel arrangement of said sub-pixel circuits and ½ of a sub-pixel pitch in the column direction of said sub-pixel arrangement of said sub-pixel circuits, and a phase difference in sub-pixel arrangement between two rows adjacent to each other is ½ of a pitch in the row direction of said light emitting portions, wherein, each sub-pixel circuit has a rectangular footprint with a longer dimension that extends between light emitting sub-pixels along a column and a shorter dimension the extends between light emitting sub-pixels in adjacent rows along a row direction.

2. An active matrix type display apparatus as claimed in claim 1, wherein three of said light emitting devices, emitting pieces of light of three different colors, form one pixel as a unit; said light emitting devices are arranged in delta relation in which sub-pixels of an identical luminescent color are not adjacent to each other and central positions of three sub-pixels of the three different colors within one pixel are adjacent to one another and form a triangle; and sub-pixels adjacent to one another in the column direction are arranged in alternating normal and inverted delta shapes, or triangles whose tops and bottoms are inverted with respect to each other, within two sub-pixel rows.

3. An active matrix type display apparatus as claimed in claim 1, wherein connecting portions for connecting said light emitting portions with said sub-pixel circuits in two sub-pixels of said sub-pixel circuits adjacent to each other in the row direction form a unit, and are arranged at positions different from each other between the two sub-pixels.

4. An active matrix type display apparatus as claimed in claim 1, wherein said connecting portions are arranged outside light emitting regions of determined shape in said light emitting portions.

5. An active matrix type display apparatus as claimed in claim 3, wherein said connecting portions are arranged outside light emitting regions of determined shape in said light emitting portions.

6. An active matrix type display apparatus as claimed in claim 3, wherein layouts of circuit devices in said sub-pixel circuits are identical between said two sub-pixels.

7. An active matrix type display apparatus as claimed in claim 1, wherein layouts of circuit devices in said two sub-pixels of said sub-pixel circuits are symmetrical with respect to a boundary line between columns of said sub-pixel circuits.

8. An active matrix type display apparatus as claimed in claim 6, wherein the layouts of circuit devices in said two sub-pixels of said sub-pixel circuits are symmetrical with respect to a boundary line between columns of said sub-pixel circuits.

9. An active matrix type display apparatus as claimed in claim 7, wherein said sub-pixel circuits have a power supply line routed at a boundary of said two sub-pixels along the column direction, and the power supply line is shared between said two sub-pixels.

10. An active matrix type display apparatus as claimed in claim 1, wherein said sub-pixel circuits in two rows adjacent to each other form a unit, and layouts of circuit devices in sub-pixels of the two rows are symmetrical with respect to a boundary line between the rows.

11. An active matrix type display apparatus as claimed in claim 6, wherein said sub-pixel circuits in two rows adjacent to each other form a unit, and layouts of circuit devices in sub-pixels of the two rows are symmetrical with respect to a boundary line between the rows.

12. An active matrix type display apparatus as claimed in claim 10, wherein said sub-pixel circuits have a scanning line routed at a boundary of the sub-pixels of said two rows along the row direction, and the scanning line is shared between the sub-pixels of said two rows.

13. An active matrix type display apparatus as claimed in claim 1, wherein said sub-pixel circuit has a slit formed in the vicinity of a connecting portion of a circuit device present in a pattern of wiring, along a direction of the wiring.

14. An active matrix type display apparatus as claimed in claim 1, wherein said light emitting device is an organic electroluminescence device having a first electrode, a second electrode, and an organic layer including a light emitting layer between the electrodes.

15. An active matrix type display apparatus as claimed in claim 1, wherein said sub-pixel circuit is a thin film transistor circuit.

16. An active matrix type display apparatus formed by arranging sub-pixel circuits for driving organo-electroluminescent light emitting devices of light emitting portions in sub-pixel units in a matrix manner, wherein:

light emitting sub-pixels are arranged in rows and columns with every other row of light-emitting sub-pixels being offset relative to the remaining rows by half the pitch of the sub-pixels in the row direction, the light-emitting sub-pixels are arranged in rows and columns without any offset between rows or columns, each sub-pixel circuit has a rectangular footprint with a longer dimension that extends between light emitting sub-pixels along a column and a shorter dimension the extends between light emitting sub-pixels in adjacent rows along a row direction, the light-emitting sub-pixels being spaced along a row at a pitch that is twice the pitch of the light-emitting sub-pixels along a column, the sub-pixel circuits being spaced along a column at a pitch that is twice the pitch of the sub-pixel circuits along a row, and said sub-pixel circuits have a slit formed in the vicinity of a connecting portion of a circuit device present in a pattern of wiring, along a direction of the wiring.

17. An active matrix type display apparatus as claimed in claim 16, wherein said light emitting device is an organic electroluminescence device having a first electrode, a second electrode, and an organic layer including a light emitting layer between the electrodes.

18. An active matrix type display apparatus as claimed in claim 16, wherein said sub-pixel circuit is a thin film transistor circuit.

19. An organo-electrolumniscent dieplay having light-emitting sub-pixels arranged in a first matrix and corresponding sub-pixel circuits arranged in a second matrix, wherein:

the light emitting sub-pixels are arranged in rows and columns with every other row of light-emitting sub-pixels being offset relative to the remaining rows by half the pitch of the sub-pixels in the row direction, the light-emitting sub-pixels are arranged in rows and columns without any offset between rows or columns.

each sub-pixel circuit has a rectangular footprint with a longer dimension that extends between light emitting sub-pixels along a column and a shorter dimension the extends between light emitting sub-pixels in adjacent rows along a row direction, the light-emitting sub-pixels being spaced along a row at a pitch that is twice the pitch of the light-emitting sub-pixels along a column, and the sub-pixel circuits being spaced along a column at a pitch that is twice the pitch of the sub-pixel circuits along a row.

\* \* \* \* \*